United States Patent
Pauliac

(10) Patent No.: US 9,429,839 B2
(45) Date of Patent: Aug. 30, 2016

(54) LITHOGRAPHY PROCESS

(75) Inventor: Sebastien Pauliac, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 122 days.

(21) Appl. No.: 14/111,362

(22) PCT Filed: Apr. 12, 2012

(86) PCT No.: PCT/EP2012/056619
§ 371 (c)(1),
(2), (4) Date: Dec. 17, 2013

(87) PCT Pub. No.: WO2012/140106
PCT Pub. Date: Oct. 18, 2012

(65) Prior Publication Data
US 2014/0109785 A1 Apr. 24, 2014

(30) Foreign Application Priority Data
Apr. 12, 2011 (FR) ...................................... 11 53176

(51) Int. Cl.
*G03F 7/004* (2006.01)
*G03F 7/00* (2006.01)
*B82Y 10/00* (2011.01)
*B82Y 40/00* (2011.01)
(Continued)

(52) U.S. Cl.
CPC ............ *G03F 7/0035* (2013.01); *B82Y 10/00* (2013.01); *B82Y 40/00* (2013.01); *G03F 7/0002* (2013.01); *G03F 7/70425* (2013.01); *G03F 7/70466* (2013.01); *G03F 9/708* (2013.01); *G03F 9/7076* (2013.01); *G03F 9/7084* (2013.01)

(58) Field of Classification Search
None
See application file for complete search history.

(56) References Cited

U.S. PATENT DOCUMENTS 5,422,309 A 6/1995 Zettler et al.
5,529,953 A 6/1996 Shoda
(Continued)

FOREIGN PATENT DOCUMENTS

JP 2007-507860 3/2007
JP 2007-230229 9/2007

OTHER PUBLICATIONS

Wissen et al. "Strategies for hybrid techniques of UV lithography and thermal nanoimprint" European Mask and Lithography Conference, Dresden, Germany, Jan. 21-24, 2008. p. 383-393.*

(Continued)

*Primary Examiner* — Blake A Tankersley
*Assistant Examiner* — Michael Robinson
(74) *Attorney, Agent, or Firm* — Oblon, McClelland, Maier & Neustadt, L.L.P.

(57) ABSTRACT

A lithography method including: a preparation, during which a resist layer is deposited on a substrate, and a preliminary lithography carried out to define at least one preliminary pattern in the resist layer, and during the preliminary lithography, a formation of at least one positioning mark forming a relief in the resist layer. The method further includes at least one subsequent lithography applied to the resist layer and including: a preliminary positioning including positioning a lithography mechanism as a function of the at least one positioning mark, and at least one formation of additional patterns in the resist layer using the lithography mechanism positioned as a function of the at least one positioning mark.

23 Claims, 3 Drawing Sheets

Figure 1A:
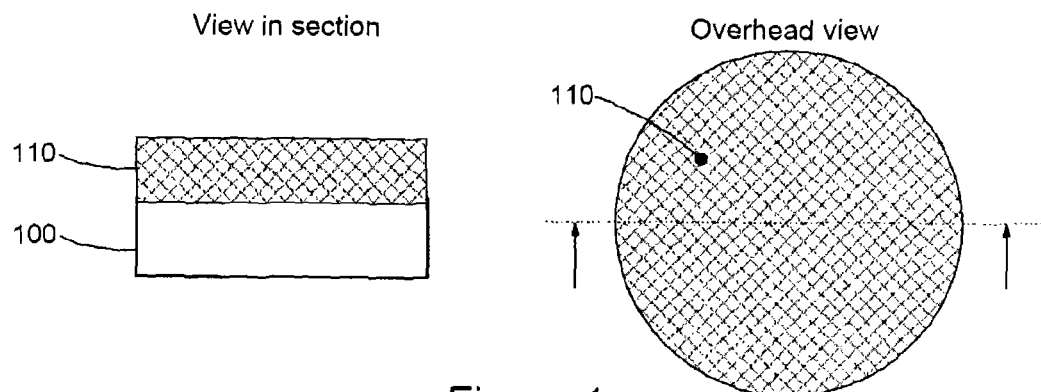

(51) Int. Cl.
  *G03F 7/20* (2006.01)
  *G03F 9/00* (2006.01)

(56) References Cited

U.S. PATENT DOCUMENTS

| | | | |
|---|---|---|---|
| 5,602,423 | A | 2/1997 | Jain |
| 5,614,765 | A | 3/1997 | Avanzino et al. |
| 5,705,430 | A | 1/1998 | Avanzino et al. |
| 5,801,099 | A | 9/1998 | Kim et al. |
| 5,877,076 | A | 3/1999 | Dai |
| 6,033,977 | A | 3/2000 | Gutsche et al. |
| 6,344,892 | B1 | 2/2002 | Sugita et al. |
| 7,691,275 | B2 | 4/2010 | Willson et al. |
| 2005/0064344 | A1* | 3/2005 | Bailey et al. .............. 430/320 |
| 2006/0228651 | A1 | 10/2006 | Tajima et al. |
| 2007/0102838 | A1* | 5/2007 | Simon ...................... 264/40.1 |
| 2007/0176320 | A1 | 8/2007 | Nakamura et al. |
| 2007/0275311 | A1 | 11/2007 | Wang |
| 2007/0275556 | A1 | 11/2007 | Bietsch et al. |
| 2008/0067721 | A1* | 3/2008 | Yu et al. .................. 264/349 |
| 2008/0245771 | A1* | 10/2008 | Delamarche et al. ....... 216/105 |
| 2011/0003256 | A1 | 1/2011 | Van Der Heijden et al. |

OTHER PUBLICATIONS

Scheer, H.-C., et al., "Aspects of hybrid pattern definition while combining thermal nanoimprint with optical lithography", J. Vac. Sci. Technol. B, vol. 28, No. 6, pp. C6M1-C6M6, (Nov./Dec. 2010) XP 12144384.

Wissen, M., et al., "Strategies for hybrid techniques of UV lithography and thermal nanoimprint", Proc. of SPIE, vol. 6792, pp. 67920V-1 to 67920V-11, (Apr. 17, 2008) XP 40430606.

Pfeiffer, K., et al., "Multistep profiles by mix and match of nanoimprint and UV lithography", Microelectronic Engineering, vol. 57-58, pp. 381-387, (2001) XP 4302289.

Wang, J. J., "Tutorial: Status of nanoimprint lithography and device applications", Proc. of SPIE, vol. 6013, No. 6013, pp. 601302-1 to 601302-15, (Oct. 24, 2005) XP 40212253.

Written Opinion of the Searching Authorities Issued Apr. 11, 2013 in PCT/EP12/056619 filed Apr. 12, 2012.

International Search Report Issued Sep. 7, 2012 in PCT/EP12/056619 filed Apr. 12, 2012.

Notice of Reasons for Rejection issued in corresponding Japanese Application No. 2014-504309 mailed Mar. 14, 2016 (English translation).

\* cited by examiner

LITHOGRAPHY PROCESS

TECHNICAL FIELD OF THE INVENTION

The present invention relates to the lithography of integrated circuits in general and more particularly describes a lithography method involving several lithographs.

A particularly advantageous application of the invention is a lithography method that makes it possible to etch patterns on different thicknesses.

PRIOR ART

With the progressively increasing integration of circuits produced by the microelectronics industry, lithography, an essential technique used in all stages of production of these devices, must meet numerous challenges in order to be able to sustain this evolution.

In particular, even though lithography has been for decades a technique used essentially for the production of progressively smaller and progressively more precise patterns, albeit in a single plane, it is now being asked whether etching of the underlying material or materials can also be achieved on at least two different thicknesses during a single manufacturing step.

A representative example of this evolution is the technique with which a horizontal line of circuitry participating in the interconnection of the devices of an upper layer of an integrated circuit can be produced simultaneously, during the same manufacturing phase, with vertical interconnections, in other words the vias, to connect the upper layer to an already produced lower layer. At least five layers of circuitry are in fact most often necessary in order to be able to interconnect all the components of an integrated circuit, and it is important to reduce the number of manufacturing steps as much as possible. Known by the English term of "dual damascene" or "damascene", in other words "double damascening" or "damascening" respectively, in reference to the medieval method of metal inlaying, this technique supposes that the sites of the interconnection lines and vias are formed beforehand in an oxide layer deposited on the preceding interconnection layer. Trenches intended to form the interconnection lines are etched there while preserving an underlying oxide layer acting as electrical insulation. The sites of the vias are produced in the interior of the trenches in the form of vertical holes extending in the oxide as far as the lower layer to be interconnected. Thus it must be possible to achieve two different etching thicknesses, one for the trenches and the other corresponding to the vertical holes of the vias. The advantage of this technique is that the vertical holes and the interconnection trenches are then filled, during the same deposition operation, by a metal over the entire surface of a substrate formed typically by a silicon wafer. The interconnections are effectively formed after mechanochemical polishing of the wafer removes the excess metal, leaving only that encrusted in the trenches and in the vertical holes intended to form the vias.

Numerous implementations of dual damascene have been proposed, which have in common the difficulty of having to position the two levels of etching of the oxide precisely relative to one another, in other words the vertical holes intended to form the vias relative to the trenches intended to form the interconnection lines. It is therefore a delicate matter to control the definition of the final patterns obtained. This disadvantage related to the definition of the final patterns is even more problematic when the final patterns have very small dimensions.

One objective of the present invention is to limit at least this disadvantage. More particularly, another objective is to improve the definition of patterns necessitating several steps of lithography.

SUMMARY OF THE INVENTION

The present invention has as its object a lithography method comprising a step of preparation, during which a resist layer is deposited on a substrate, a step of preliminary lithography carried out to define at least one preliminary pattern in the resist layer and wherein the step of preliminary lithography comprises a step of nanoimprinting, during which a mold provided with reliefs penetrates into the resist layer to generate the at least one preliminary pattern, each preliminary pattern defining a hollow in the resist layer, and to define at least one positioning mark forming a hollow relief in the resist layer. In addition, the method comprises at least one step of subsequent lithography applied to the resist layer and comprising the following steps:

a preliminary step of positioning consisting in positioning lithography means as a function of the at least one positioning mark, at least one step of formation of hollow additional patterns in the resist layer using lithography means positioned as a function of the at least one positioning mark, the step of formation of the additional patterns comprising exposure of a part at least of the at least one preliminary pattern.

If the exposure of the resist causes disappearance of the exposed resist, the preliminary pattern is formed by an embossed zone and the additional pattern is then also formed as a hollow on the embossed zone. In this way it is possible, for example, to obtain a pattern formed by hollows that have at least two different depths or different heights in the interior of the resist layer, in other words two staircase steps. In effect, the preliminary pattern defines a first depth and the additional pattern, superposed on the preliminary pattern, defines a second depth. The depth is determined relative to the free surface of the resist layer, in other words relative to the face of the resist layer through which the mold penetrates during nanoimprinting. The height is determined relative to the face of the resist layer that is in contact with the substrate on which it rests.

If the exposure of the resist causes disappearance of the resist outside the exposed zone (irradiated negative photoresist), the final pattern can then form, for example, a projection having a first height corresponding substantially to the thickness of the resist before the subsequent lithography and a second height, smaller and corresponding to a zone embossed during nanoimprinting.

The positioning relief mark or marks therefore make it possible to position successive steps of lithography relative to one another and in very precise manner. The patterns obtained during the step of preliminary lithography are therefore well positioned relative to the patterns obtained during the steps of subsequent lithography. The final patterns, formed in two levels of depth, therefore have good definition while possibly being of small size, typically smaller than one micrometer.

In addition, the marks are created in the resist. The invention therefore does not require creating the positioning marks in the substrate and prior to definition of the patterns. It then makes it possible to avoid the steps of etching and elimination of resist, usually described by the English term stripping, which are usually necessary for creation of marks in the substrate but which degrade it. In particular, it has turned out that the solutions or techniques for etching and elimination of resist may degrade the lower layers of the substrate. The employment of etching steps may therefore be harmful, especially when the substrate contains already formed layers of integrated circuit under the resist.

The invention therefore also has the advantage of preserving the integrity of the substrate and of the possible layers that it contains.

In addition, the invention makes it possible to form positioning marks during a step of formation of patterns. It therefore tends to reduce the total number of steps and therefore the costs.

According to another aspect, the present invention has as one object a lithography method comprising: a step of preparation, during which a resist layer is disposed on a substrate and a step of preliminary lithography executed so as to define at least one preliminary pattern in the resist layer. Characteristically, the method comprises, during the step of preliminary lithography, the formation of at least one positioning mark forming a relief in the resist layer. In addition, it includes at least one step of subsequent lithography applied to the resist layer and comprising the following steps: a preliminary positioning step consisting in positioning lithography means as a function of the at least one positioning mark; a step of formation of additional patterns in the resist layer using the lithography means positioned as a function of the at least one positioning mark.

Optionally, the method according to the invention may have at least any one of the following optional steps and characteristics.

At least one among the additional patterns is superposed on the at least one preliminary pattern so as to form at least one three-dimensional pattern in the resist layer.

As an alternative to the formation of three-dimensional patterns, the additional patterns are therefore not superposed on the at least one preliminary pattern. In this way two-dimensional patterns are obtained with improved relative positioning.

The positioning step comprises the detection of the positioning marks by light diffraction.

Advantageously, at least one additional pattern is superposed on at least one preliminary pattern.

The step of formation of additional patterns is carried out so as to form at least one final hollow pattern having at least two levels of depth in the resist layer. Alternatively, the step of formation of additional patterns is carried out so as to form at least one final projecting pattern having at least two levels of height.

The method comprises, following the at least one step of subsequent lithography, a transfer step consisting in transferring the at least one preliminary pattern and the additional patterns from the resist layer into the substrate.

According to a first variant, the positioning marks are preserved at the end of the at least one step of subsequent lithography. In this way the positioning marks may be reused by other steps of subsequent lithography, thus limiting the number of necessary steps and simplifying the overall manufacturing method. If necessary, the positioning marks are then transferred from the resist layer into the substrate, to be reused by other lithographs so as to have good relative positioning of all patterns obtained by lithography. In addition, the number of steps necessary to obtain the final product will be reduced.

According to a second variant, the positioning marks are eliminated during the at least one step of subsequent lithography. Typically, in order to make these positioning marks disappear, it will be sufficient to irradiate them if the resist is a positive photosensitive resist. If the resist is a negative photosensitive resist, it will suffice not to irradiate these marks.

According to a last variant, after these marks have served for alignment, they may be finally modified to form a useful pattern that will be transferred into the substrate. Advantageously, in these two latter variants, space is not lost due to the alignment marks at the substrate. This space may be used to form functional zones.

The transfer step comprises a step of etching the resist and substrate layers. The etching advantageously has a substantially identical selectivity for the resist and for the substrate. However, it is also possible to accept a certain selectivity, which may be used in particular to influence the form of the transferred pattern, by favoring one etching compared with the other to obtain different aspect ratios. Particularly advantageously, the etching step comprises plasma etching. This type of etching is essentially anisotropic, meaning that the etching takes place essentially in a direction perpendicular to the plane of the substrate. The walls of the patterns are relatively well preserved, thus retaining the small dimensions of the patterns. This type of etching therefore makes it possible to improve the control of the resulting precision.

Advantageously at least one among the additional patterns is superposed on the at least one preliminary pattern so as to form at least one three-dimensional pattern, and the transfer step is executed so as to transfer the at least one three-dimensional pattern from the resist layer into the substrate to form in the substrate at least one final three-dimensional pattern in the resist layer.

Advantageously, the method also comprises a step of supply of an electrically conductive material into the at least one final three-dimensional pattern.

Prior to the step of preparation, at least one layer of an integrated circuit is formed in the substrate. In addition, the transfer step and the supply step are executed so that the electrically conductive material forms an interconnection line as well as a vertical interconnection connecting the said line to the at least one layer of the integrated circuit.

The line is formed by a trench extending in a plane substantially parallel to the surface of the substrate. The vertical interconnection, or via, is formed by a vertical hole receiving an electrically conductive material and extending substantially perpendicular to the surface of the substrate and from the trench. It extends as far as an underlying layer of the substrate that forms or is intended to form a layer of the integrated circuit. In this way the invention makes it possible to create interconnections particularly precisely, since the positioning marks make it possible to position the vertical holes very precisely relative to the trenches intended to form the lines. In addition, the formation of these interconnections is achieved without degrading the underlying layers of the substrate.

Advantageously the electrically conductive material is of copper. The invention proves particularly advantageous since this material has the drawback of not being depositable by the customary techniques such as screen printing, but does have the advantage of conducting electricity better than the materials usually employed with these customary techniques. By virtue of these conduction properties, the copper therefore makes it possible to limit the power necessary for functioning of the circuit. It also makes it possible to reduce the width of lines and interconnections, thus leading to a reduction of the size of the integrated circuits.

The step of preliminary lithography is separate from the step of subsequent lithography.

Preferably the step of preliminary lithography comprises a step of nanoimprinting, during which a mold provided with reliefs penetrates into the resist layer to generate the at least one positioning mark and the at least one preliminary pattern.

This embodiment is particularly advantageous since it makes it possible especially to generate positioning marks in relief without necessitating any additional step of resist etching and elimination, which furthermore could degrade the substrate. In addition, it does not necessitate any step of development of the resist to obtain the positioning marks in relief, thus avoiding any contamination of the resist by the development solutions. The quality of the patterns obtained by the subsequent steps will therefore be improved.

In addition, this embodiment makes it possible to define patterns of very small size.

The step of formation of additional patterns in the resist layer comprises a step of photolithography or a step of electron-beam lithography or a step of ion-beam lithography.

The succession of a step of lithography by nanoimprinting followed by a step of optical, electronic or ionic lithography positioned relative to the step of lithography by nanoimprinting makes it possible to define patterns of very great precision and perfectly controlled relative position.

The step of nanoimprinting is carried out so that the at least one preliminary pattern defines a hollow in the resist and that the step of formation of additional patterns is carried out so that at least one of the additional patterns is at least partly superposed on the said preliminary pattern defining a hollow. This method therefore makes it possible to generate, in the resist, three-dimensional patterns having improved precision in shape. In particular, this embodiment proves to be very advantageous for obtaining three-dimensional patterns having reduced dimensions, typically smaller than 100 or even 50 nanometers, wherein control of the shape is improved.

In addition, this embodiment makes it possible to obtain three-dimensional patterns insulated from one another. The known techniques for formation of three-dimensional patterns are based on continuity of certain patterns in order to limit the consequences that imprecisions of relative positioning between the successive steps of lithography have on the shape of the final patterns.

The method according to the invention therefore makes it possible to obtain three-dimensional patterns of small size and insulated from one another.

According to one embodiment, the step of formation of additional patterns is carried out so that at least one of the additional patterns is at least partly superposed on the said preliminary pattern defining a hollow and so as to make the resist residues at the bottom of the hollow disappear or so as to create holes extending from the hollow to the substrate.

This method according to the invention therefore makes it possible to make the resist at the bottom of the patterns disappear if the entire width of the preliminary pattern, in other words the entire zone embossed during the preliminary lithography, is covered by the additional pattern. In this way a considerable disadvantage of the lithography by nanoimprinting is resolved.

Alternatively, by causing the resist to disappear only over part of the preliminary pattern, in other words over a part of the zone embossed during preliminary lithography, it is possible to form openings permitting communication between the preliminary pattern and the substrate. The final patterns obtained in this way typically make it possible to form vertical interconnections between several levels of an integrated circuit.

According to an advantageous embodiment, the resist is a photosensitive resist, the step of formation of additional patterns in the resist layer comprises a step of photolithography and the said exposure comprises irradiation of one part at least of the at least one preliminary pattern.

According to an advantageous embodiment, the step of formation of additional patterns in the resist layer comprises a step electron-beam lithography or a step of ion-beam lithography and the exposure comprises writing of one part at least of the at least one preliminary pattern.

According to an advantageous embodiment, the resist is a positive photosensitive resist, the step of subsequent lithography comprises a step of photolithography comprising a step of irradiation carried out so as to make the residues of resist at the bottom of the hollows disappear or so as to create holes extending from the hollows to the substrate.

Preferably the step of preliminary lithography defines first zones having a first thickness and second zones each having a thickness smaller than the first thickness, and in which the at least one step of subsequent lithography is carried out so as to make the resist disappear at least partly in at least some of the second zones. In this way the method makes it possible to make the residues of resist at the bottom of the second zones disappear or to create holes extending from these second zones to the substrate.

According to one embodiment, the step of formation of additional patterns in the resist layer comprises a step of photolithography or a step of electron-beam lithography or a step of ion-beam lithography.

According to another embodiment, the step of formation of additional patterns comprises a step of nanoimprinting, during which a mold comprising reliefs penetrates into the resist layer to generate the additional patterns.

The method may also comprise several steps of subsequent lithography, each comprising a step of formation of additional patterns selected from among: a step of nanoimprinting, a step of photolithography, a step of electron-beam lithography, a step of ion-beam lithography.

In particular, it is provided that a first step of subsequent lithography comprises a step of photolithography and that a second step of subsequent lithography comprises one among the following steps: a step of photolithography, a step of electron-beam lithography, a step of ion-beam lithography.

In this way the invention makes it possible to achieve several lithographs without performing preliminary steps of generation of alignment marks in the substrate. In this way the number of steps (and therefore the cost) for achieving a combination of lithographs with alignment is reduced.

Preferably the positioning mark forms a hollow relief in the resist layer. Alternatively, the positioning mark forms a projecting relief in the resist layer.

According to one possibility, the positioning mark forms a preliminary pattern. The positioning mark serving for positioning of the subsequent lithography steps is therefore also transferred into the substrate.

According to one possibility, the preliminary patterns have a depth smaller than the depth of the alignment marks.

According to another aspect, the invention also has as its object a method for manufacture of a microelectronic device comprising at least one step of lithography for generating patterns in a resist topping a substrate and involving a lithography apparatus, wherein the step of lithography comprises a step of positioning of the lithography apparatus. The step of positioning comprises a step of detection of at least one positioning mark formed in relief in the resist layer and a step of positioning of the lithography apparatus relative to the at least one positioning mark.

By microelectronic device there is understood any type of device created with microelectronic means. These devices encompass in particular not only devices with purely electronic purpose but also micromechanical or electromechanical devices (MEMS, NEMS, etc.) as well as optical or optoelectronic devices (MOEMS, etc.).

This method may comprise at least any one of the foregoing characteristics. In particular, the at least one positioning mark may advantageously be obtained by a step of nanoimprinting.

According to another aspect, the invention has as an object a multilayer assembly obtained according to any one of the embodiments of the method described hereinabove.

The invention has as yet another object a multilayer assembly comprising a substrate topped with a resist layer, characterized in that the resist layer comprises at least one positioning mark formed in relief in the resist layer and configured to permit positioning of a lithography apparatus relative to this at least one positioning mark.

Optionally but particularly advantageously, the at least one positioning mark is obtained by nanoimprinting.

Advantageously, the at least one positioning mark has a depth greater than the depth of the preliminary patterns.

According to a particular embodiment, the final pattern has more than two levels of depth or more than two heights. Advantageously, the mold has reliefs of several heights for defining preliminary patterns of different depths.

Another object of the present invention relates to a method for manufacturing a microelectronic device from an assembly of multilayers according to the invention, comprising at least one step of lithography for generating patterns in the resist layer of the multilayer assembly and using a lithography apparatus. The step of lithography comprises a step of positioning of the lithography apparatus. The step of positioning comprises a step of detection of the at least one positioning mark formed in relief in the resist layer and a step of positioning of the lithography apparatus relative to the at least one positioning mark.

Advantageously the step of lithography also comprises a step of formation of additional patterns in the resist layer using the lithography apparatus positioned as a function of the at least one positioning mark, the step of formation of the additional patterns comprising the exposure of one part at least of the at least one preliminary pattern so as to form at least one final hollow pattern having at least two levels of depth in the resist layer or a final projecting pattern having at least two levels of height.

The purposes, objects, as well as the characteristics and advantages of the invention will become more apparent from the detailed description of an embodiment thereof illustrated by the following accompanying drawings, wherein:

FIG. 1, comprising FIGS. 1a to 1g, illustrates an exemplary embodiment of the method according to the invention, this method example making it possible to achieve three-dimensional lithography with excellent definition.

Figure 2:
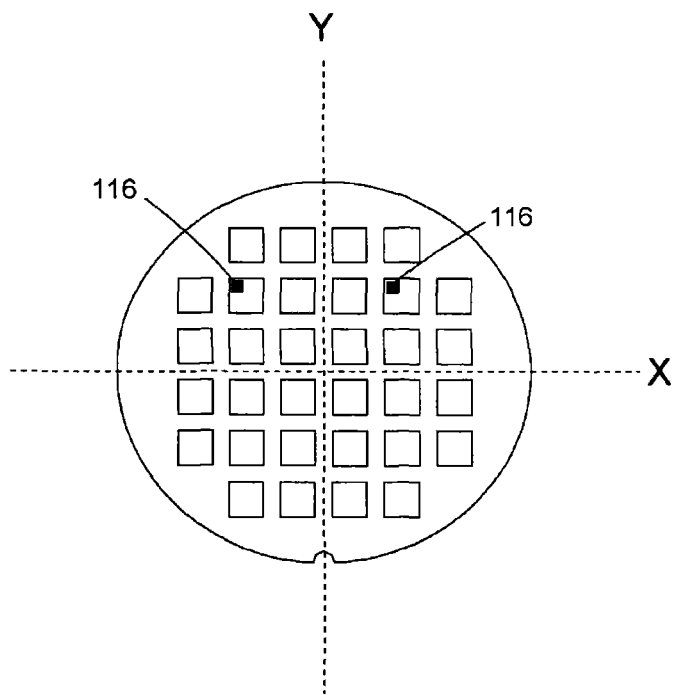

FIG. 2 illustrates the optimum positioning of devices on a wafer during manufacture.

The attached drawings are provided by way of examples and are not limitative of the invention.

DETAILED DESCRIPTION OF THE INVENTION

FIG. 1, which comprises FIGS. 1a to 1g, illustrates the main steps of implementation of the method according to the invention making it possible to achieve three-dimensional lithography with excellent definition. As will be recalled hereinafter, the present invention is not limited to the creation of three-dimensional patterns. Nevertheless, the formation of a three-dimensional pattern brings out the advantages of the invention particularly explicitly. Within the scope of the present invention, the term three-dimensional pattern designates a pattern having, in a given layer, for example a resist or a substrate, at least two levels of depth below the upper face of the layer when the pattern is hollow or at least two levels of height above an upper face of the layer when the pattern is projecting. This is clearly apparent on FIGS. 1f and 1g, for example, which will be described in detail hereinafter.

The invention combines several types of lithography that have been developed over the years. Lithography by nanometric printing, or in English "nanoimprint lithography" or NIL, consists in defining patterns of nanometric size from an imprinted mold. This technique, known since the mid-1990s, from that time on was part of the international roadmap of technologies for semiconductors or ITRS, "international technology roadmap for semiconductors".

As illustrated in FIG. 1a, the invention implements this technique by starting from a substantially uniform resist layer 110. This resist layer 110 is traditionally deposited on the devices during manufacture. Typically it is deposited by centrifugation, usually referred to as "spin coating". The invention does not hypothesize as to the nature of the device during manufacture. It will typically involve an integrated circuit or any optoelectronic or electromechanical type of device whatsoever, developed and produced by the microelectronics industry and requiring the use of lithography to define geometric patterns in each step of manufacture. The substrate 100 or support on which resist layer 110 is deposited is therefore, for example, a semiconductor wafer on which devices are constructed. The wafer is composed, for example, of a crystalline semiconductor, typically silicon. Resist layer 110 covers the substrate 100 or wafer over its entire surface. Substrate 100 may be in an advanced stage of its manufacture. In particular, each substrate may already have a large number of diverse layers, not represented, bearing a very large number of patterns.

Figure 1B:
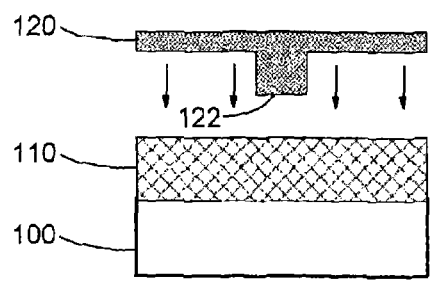

The next step, shown schematically in FIG. 1b, is a step of preliminary lithography. It consists in particular of imprinting, in resist layer 110, relief patterns 122 of a mold 120 serving to define one part of patterns of different thicknesses to be formed in the layer to be etched. Typically, in the case of implementation of the invention for dual damascening discussed in the section on the prior art, the trenches are formed in resist 110 by means of the mold and then, after transfer into an underlying layer of oxide, will be filled with the metal used to form the interconnection lines.

Figure 1C:
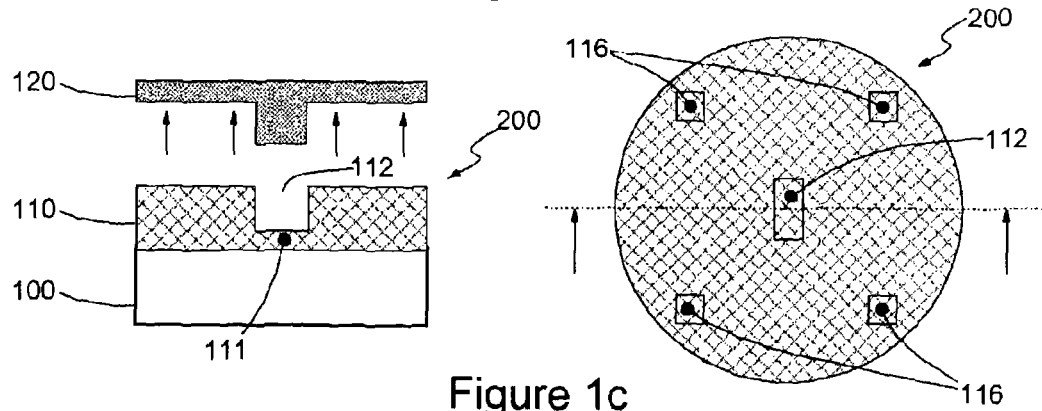

The stripping of the mold, which is shown schematically in FIG. 1c, may be carried out after solidification of resist 110. While the mold is in place, shaping is achieved by heating the assembly (mold, resist 110 and substrate 100), to a temperature that is not permitted to exceed the cross-linking temperature in the case of a negative photosensitive resist or the thermal deprotection temperature in the case of a positive photosensitive resist, in order to preserve all their photosensitive properties. Solidification takes place after the heating step. This technique is better known by the acronym TNIL for thermal nanoimprint lithography, in other words lithography combined with thermal nanoimprinting.

The mold leaves as many imprints 112 in resist 110 as there are reliefs 122 in the mold. For clarity, without detracting in any way from the description of the invention and without limiting its scope, a single imprint 112 is represented here. In practice, for example in order to produce an integrated circuit, the most dense of which may now comprise hundreds of millions and even in excess of one billion transistors, a corresponding number of patterns may have to be imprinted by the mold during a single imprinting operation. It will also be noted that the scale on which the single imprint 112 is represented is not in the same proportion as the representation of substrate 100 and mold 120. In fact, the substrates or wafers commonly have a diameter up to several tens of centimeters ($10^{-2}$ meter), typically 30 centimeters, while the patterns to be imprinted measure tens of nanometers ($10^{-9}$ meter).

The invention provides that positioning marks 116, also referred to as alignment marks, are imprinted in resist 110 during the same imprinting operation and are therefore present on the mold, just as the patterns, in the form of reliefs. These positioning marks 116 are used in standard manner by the devices for positioning the substrates. They will serve for the ensuing lithography operation described hereinafter.

This step therefore made it possible to define a multilayer assembly 200 comprising a substrate 100, a resist layer 110 in which at least one positioning mark 116 and preferably several positioning marks 116 are formed.

In the illustrated embodiment, positioning marks 116 are non-functional for the circuits being manufactured. Their sole function is to permit the positioning of several successive lithographs. In effect, these marks usually have specific shapes, which facilitate their detection by the detection and positioning systems.

Within the scope of the present invention, the marks have standard shapes capable of being detected by the usual positioning systems. According to an alternative embodiment, the marks also serve to define the pattern of the circuit to be formed. The number and disposition of marks on substrate 100 depend on the type of positioning system used. As an example, they are four in number and situated, as represented, close to the periphery of the substrates, where the positioning defects may be observed with greater amplitude.

In all imprints 112 left by the mold, it will be noted that a controlled thickness 111 of resist 110 remains, depending on the initial thickness of resist 110 deposited by centrifugation and by the height of reliefs 122 of mold 120. In the standard implementation of nanoimprint lithography, this is considered to be a residue that must be removed before being able to transfer the imprinted patterns into the underlying layer to be etched. As will be seen hereinafter, the invention takes advantage of this drawback in order to obtain different resist thicknesses during the same lithography operation.

The step of preliminary lithography therefore consists in forming preliminary patterns and positioning marks in the resist layer. In the illustrated example, this step comprises nanoimprinting. Nevertheless, the preliminary patterns and the positioning marks may be formed in the resist by optical or ion-beam or electron-beam lithography. For that, it may advantageously be provided to deposit a double layer of photosensitive resist, wherein the two resist layers have different tones or, if they have the same tones, different sensitivities to irradiation. It will be possible, for example, to use a stack of a negative resist, for example in contact with the substrate, and of a positive resist. This positive resist will then be irradiated and developed to form the desired patterns.

This step of preliminary lithography is followed by at least one step of subsequent lithography applied to the resist layer. For each step of subsequent lithography, positioning relative to the positioning marks is carried out, followed by a step of formation of additional patterns in the resist layer. In known manner, the positioning step comprises a step of detection and location of positioning marks.

Figure 1D:
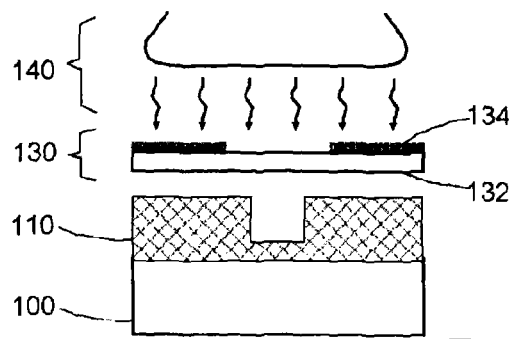

In the example illustrated in FIG. 1d, the step of formation of additional patterns comprises a step of optical lithography. This is a standard operation of irradiation 140 of the resist through a mask 130, which will have been able to be positioned very precisely by virtue of positioning marks 116 imprinted by the mold during the step of preliminary lithography. In the standard case, the mask is a mask made of a transparent material 132, of quartz, on which opaque chromium patterns 134 have been formed. Depending on the particular implementation of this standard operation of optical lithography, the mask, after positioning, may be applied either directly on resist layer 110 (contact lithography) or in proximity, in order to irradiate it selectively through the transparent parts. The mask may also be a reticle, in other words a generally enlarged mask of a single one of the devices during manufacture. The reduced image of the reticle is then projected and repeated with appropriate optical and mechanical means, not illustrated, on the entire surface of resist 110 covering substrate 100 in order to obtain better definition of the patterns.

The step of formation of additional patterns in the resist layer of FIG. 1d may also be achieved without a mask by irradiating resist 110 with a guided ion beam or electron beam to write each of the patterns. This latter technique is known by the names of "electron-beam lithography" or "electronic lithography" and is often designated by the abbreviation "e-beam" from the English "electron beam". Electronic lithography is the technique that makes it possible to achieve very high resolution of the patterns to be etched, at the cost of having to write each of the patterns of each of the devices of a substrate sequentially. Such an operation is very time-consuming and therefore costly.

Thus, within the scope of the present invention, exposure of a resist zone is also referred to as irradiation of the resist zone if the lithography is photolithography or writing of the resist zone if the lithography is ion-beam or electron-beam lithography.

The step of formation of additional patterns in the resist layer may also comprise new nanoimprinting.

Regardless of the lithography technique used at this stage, the method according to the invention employs alignment marks 116 discussed in the foregoing in order to be positioned very precisely relative to the preceding nanoimprinting operation.

Figure 1E:
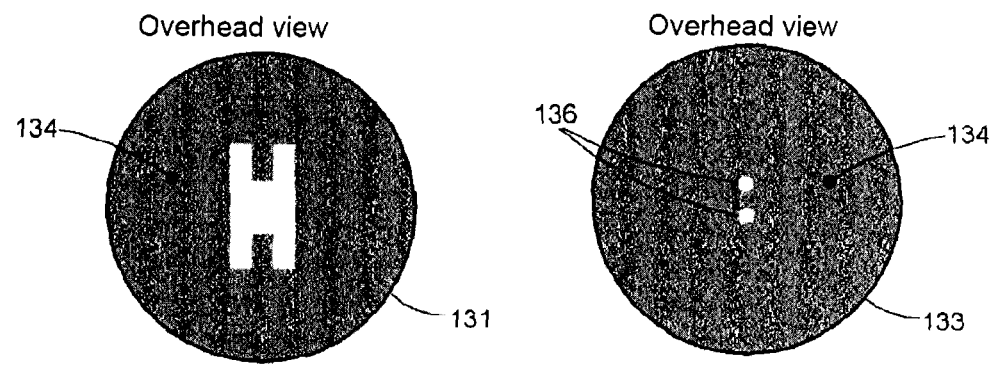

FIG. 1e gives examples of masks 131 and 133 to be used respectively with a negative photosensitive resist and with a positive photosensitive resist in order to obtain different resist thicknesses.

With a positive photosensitive resist, the zones irradiated through the transparent parts of mask 133 become soluble and disappear during the operation of development of the resist following irradiation. The use of a positive resist and of a mask of type 133 is therefore appropriate for a use of the invention for the dual damascening discussed in the section on the prior art. In this case, the surface area of openings 136 of the mask is very small and in this example corresponds to interconnection holes 118 that must be formed in imprints 112 left by mold 120 in the resist. Most of mask 133 is therefore covered by chromium 134. Once again, it will be noted that, for clarity only two interconnection holes are represented on mask 133, although in practice a very large number will of course have to be formed to assure the vertical interconnections between the layer being formed and the already formed lower layer.

Figure 1F:
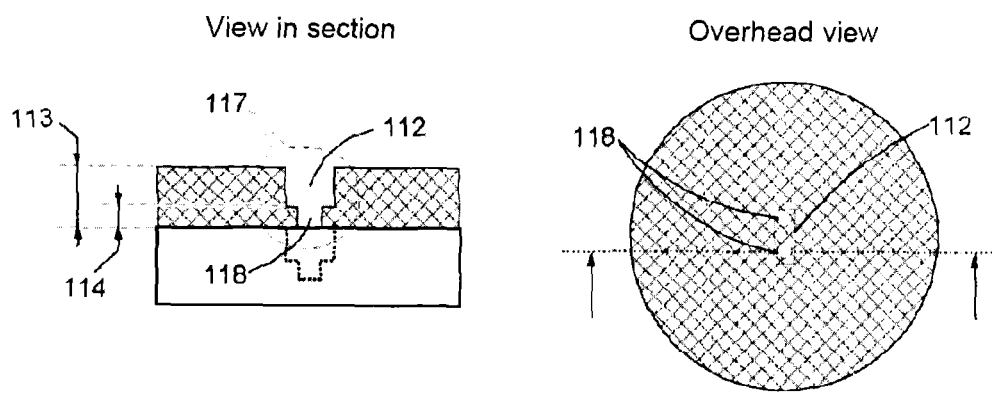

The result of the optical lithography corresponding to the use of a positive resist with the mask of type 133 is shown in FIG. 1f, in section through one of the additional patterns 118 forming interconnection holes, and in overhead view. The two interconnection holes of this example are formed at the bottom of trenches 112 corresponding to the zones embossed by mold 120 after irradiation and development of resist 100. Two resist thicknesses are in fact obtained: 113 and 114. As indicated by the arrows in the figures, these thicknesses are defined from the face of resist layer 110 that rests on substrate 100. Zone 114 was embossed by the mold. The thickness of this zone was therefore reduced relative to step 1a. Zone 113 was not or was only slightly embossed by the mold. In addition, the zone corresponding to the additional pattern 118 defines another resist thickness that is zero. The structure of final pattern 117 before transfer therefore has two different hollow heights in the resist layer, a zero hollow height corresponding to zone 108 and a hollow height 114 corresponding to the hollow left by imprints 112 of mold 120. In other words, final pattern 117 has two different depths, a depth equal to the thickness of the resist layer, obtained at the end of the subsequent lithography, and a lower depth formed by the hollow left by imprints 112 of mold 120. At the end of the subsequent lithography, a pattern 117 having two levels of depth in the resist is indeed obtained in this way. It is therefore possible to measure at least three different resist thicknesses, in increasing order: a first thickness 113, where the layer was not modified or was modified slightly, a second thickness 114 defined by a hollow formed during the preliminary lithography, and a third thickness defined by a hollow formed during the subsequent lithography, this thickness being zero in the example illustrated in FIG. 1f. The patterns formed in this way on two levels in resist 110 are transferable into the underlying layer by means of anisotropic dry etching, making it possible to transfer patterns from resist 110 to substrate 100. This etching may be purely physical: there is no chemical reaction with the substrate 100, the etching results solely from the bombardment of the sample by ions (IBE etching: ion-beam etching or electron-beam etching). It may also be at least partly chemical (PE plasma etching, RIE reactive ion etching). If the substrate and the resist have substantially equal sensitivity to etching, the patterns will be transferred without deformation from the resist to the substrate. It is also possible to accept a certain degree of selectivity between the resist and the substrate in order to adapt the shape of the transferred patterns.

Used to implement the dual damascening technique, the multidimensional structure of final pattern 117 obtained at the end of the second optical lithography will serve, after transfer into an underlying oxide layer, to form the interconnecting lines of the corresponding circuitry layer as well as the vias with the lower circuitry layer. The method of the invention is not limited in any way to use solely for dual damascening. It may advantageously serve for other applications in lithography whenever it is necessary to be able to obtain two different resist thicknesses 110 or whenever it is necessary to perform lithography operations that must be mutually positioned with precision.

Figure 1G:
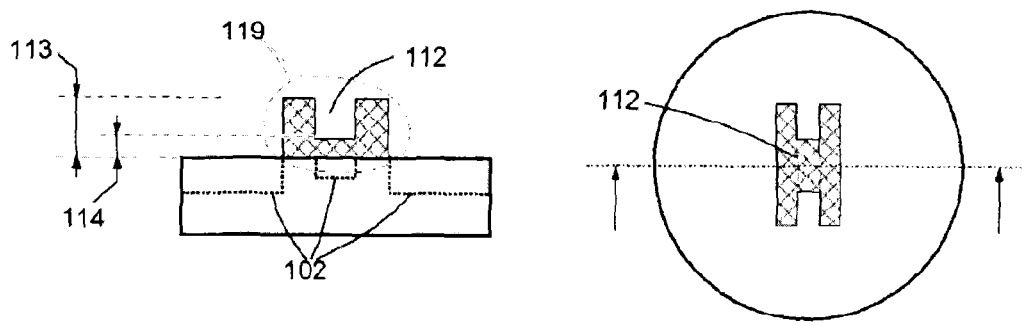

FIG. 1g shows the result of the use of a negative resist and of a mask of type 131. In the case of a negative photosensitive resist, the irradiated zones become insoluble and therefore remain in place after development of the resist. As in the foregoing, two resist levels (113 and 114) are obtained after the second optical lithography, albeit with a different final pattern 119 for other applications of the method. As indicated hereinabove, this resist structure is transferred into the underlying layer by resorting to anisotropic etching, in this case non-selective, of the plasma etching type in order to obtain two different depths of etching 102 without deformation of patterns 119.

At the end of the subsequent lithography, a pattern 119 having two levels of depth in the resist is obtained in this way. It is therefore possible to measure at least three different resist thicknesses, in increasing order: a first thickness 113, where the layer was not modified or was modified slightly, a second thickness 114 defined by a hollow formed during the nanoimprinting, and a third thickness defined by a hollow formed during the subsequent photolithography, this thickness being zero in the example illustrated in FIG. 1g. This three-dimensional pattern 119 can therefore be transferred into the substrate 100.

The method described hereinabove makes it possible to obtain excellent alignment between the two levels of lithography: in other words, between the step of preliminary lithography (nanoimprinting in the illustrated case) and the step of subsequent lithography (optical lithography in the illustrated case) by using positioning marks 116 imprinted in resist 110 during the step of preliminary lithography. In this way final patterns with perfect positioning of the preliminary patterns and additional patterns are obtained. When the combination of these patterns defines three-dimensional patterns, these three-dimensional patterns then exhibit very good definition.

The invention proves to be particularly advantageous for creating 3D patterns in isolation and with very small dimensions, in other words with dimensions typically smaller than 100 nanometers.

Particularly advantageously, the positioning marks are generated and are detected in the resist layer. The invention does not require any step of etching of positioning marks in order to transfer them into the substrate. Therefore no etching or stripping step will degrade the underlying layers of the substrate.

In the example detailed in the foregoing, the step of preliminary lithography comprises only one nanoimprinting step. That has the advantage of generating positioning marks by simple embossing of the resist layer. This layer does not have to be developed to form the reliefs defining the alignment marks. Now, it turns out that the use of the development solutions normally employed in the steps of optical, electronic or ion-beam lithography degrade the resist. Its sensitivity is degraded, leading to a deterioration of the resolution during the subsequent steps of lithography. The embodiment of the invention using nanoimprinting for the step of preliminary lithography therefore makes it possible to improve the definition of the patterns obtained significantly.

In addition, the successive developments of the resist have a tendency to "erode" the already formed patterns, thus leading to reduction of the aspect ratio and to degradation of the geometry of the final patterns. That proves to be all the more manifest when the patterns have a high aspect ratio. In this way the invention, by providing a nanoimprinting step for the formation of positioning marks and preliminary patterns, makes it possible to reduce the number of development steps and to improve the geometry of the patterns compared with methods based on photolithography, for example, to form the positioning marks. Consequently, positioning marks, even of very small dimensions and, for example, intended to be detected by diffraction, will retain good geometry after a step of development during the subsequent lithography and will be available for reuse for an additional lithography.

In addition, the invention permits the use of photosensitive resists of positive tone or negative tone.

According to one embodiment, the reliefs of the mold intended to form the alignment marks do not have the same height as the reliefs of the mold intended to form the preliminary patterns. Thus the alignment marks and the preliminary patterns have different depths. Typically, the depth of the alignment marks is greater than that of the preliminary patterns. Preferably, the depth of all the alignment marks is identical and the depth of all the preliminary patterns is identical. This difference in height of the reliefs of the mold or of depth of the marks and of the preliminary patterns makes it possible to achieve "partial" nanoimprinting of the resist layer for these latter patterns, in other words nanoimprinting of small depth, so that the final patterns to be created can be modeled freely. For the alignment marks, the deepest possible nanoimprinting is advantageously performed, so as to improve their aspect ratio and the precision that is very important for permitting precise detection, for example by diffraction, and to obtain improved positioning.

Furthermore, the implementation of nanoimprinting makes it possible to form positioning marks of very small dimensions. In this way they may be suitable for diffraction-based detection systems, thus permitting improvement of the precision of positioning of the subsequent step of lithography. Typically, the invention makes it possible to obtain positioning marks of around ten or a few tens of nanometers. The alignment precision is typically below 100 nanometers, whereas with the conventional aligners, based typically on optical detection, the alignment precision is above one millimeter. The alignment precision offered by the invention makes it possible to obtain final three-dimensional patterns of reduced size and improved quality. In fact, although the known methods make it possible to obtain only three dimensional patterns for the most part greater than one micrometer, the invention easily makes it possible to obtain three-dimensional patterns smaller than one millimeter.

Thus the invention may also extend to hybrid or composite lithographs. As a reminder, a hybrid or composite lithograph involves at least two types of lithograph, since the patterns created during different steps of hybrid lithography overlap, whereas the patterns created during the different steps of composite lithography do not overlap.

The number of steps of subsequent lithography using the positioning marks is not limited.

The imprinted positioning marks cannot be etched. In contrast to the standard lithography method in which the patterns and therefore the positioning marks are systematically etched, it is possible here to retain them or eliminate them or modify them as a function of whether it is wished subsequently to carry out a manufacturing process using the method of the invention. If the marks must be eliminated, it is sufficient, in the case of a negative resist, to refrain from irradiating them. If the resist is positive, on the other hand, the marks must be irradiated. The mask or the reticle will therefore be adapted as needed.

It will be noted that, when the positioning marks are etched, the steps of subsequent lithography will be able to reuse them without having to generate any new marks. In this way, steps of lithography, etching and removal of resist are eliminated, thus permitting a reduction of the duty factor of the equipment as well as a reduction of the consumables used, leading to lowering of the cost of production of the device.

The positioning marks imprinted in the resist possess a certain topography. In this way they can be detected by the positioning systems. For example, the detection systems based on light diffraction can detect them, just as can optical recognition systems. Numerous positioning systems developed by the different equipment providers exist. For example, the equipment provider ASML offers the TTL system, an acronym for Through-The-Lens, in other words through the lens, or the ATHENA system.

As an example, two types of marks may be used for an ASML 300 stepper: the marks known as PM (Primary Marks) or the marks known as SPM (Scribelane Primary Marks).

With the method of the invention, it is possible to use the majority of the types of marks already used in standard manner in lithography for positioning of marks. If necessary, it will be possible to adapt dimensions, especially thickness, to facilitate the detection of patterns created in the resist compared with those created traditionally in the substrate. For example, for the PM marks defined in the foregoing, it will be possible to increase the depth of these marks in the resist to 400 nm, compared with 120 nm for the same marks created in silicon substrates. These adjustments are familiar to the person skilled in the art, who already knows how to make similar adjustments as a function of the type of substrates in which these marks are created in the prior art. It should be noted that the corresponding patterns of the imprinting mold will indeed have to be mirror images of the standard positioning marks. In addition, it is also necessary to invert their topography. A mark composed of trenches will have to be composed of reliefs on the mold.

The definition of patterns created in this way, compared with a technique using a single step of nanoimprinting, is better. In fact, by virtue of the step of formation of additional patterns carried out during the step of subsequent lithography, we have the possibility of minimizing all the problems and defects inherent to removal from the mold.

In particular, as already noted in the foregoing, in the standard implementation of nanoimprint lithography, the resist parts embossed by the mold are considered to be residues, which must be capable of being removed. If the additional patterns cover the entire bottom of the embossed zones, then the residues can be stripped easily and precisely.

If the additional patterns are smaller than the bottom of the embossed zones and have the form of points, then it is possible to form vertical holes particularly useful for creation of interconnections. The invention therefore makes it possible to take advantage of residues that are inevitably generated by nanoimprinting and that are usually regarded as a major drawback of that technique.

Another advantage of the present invention lies in the fact that it simpler to implement than the methods using sacrificial or anti-reflective layers. More precisely, the invention makes it possible to reduce the number of steps usually necessary with these known solutions. The invention therefore offers significant advantages in terms of simplicity, reliability and cost.

Finally, to obtain better matching of alignment with the step of imprinting the mold in resist 110, it is preferable, as shown in FIG. 2, to create an overlay symmetric relative to the X and Y axes of substrate 100. In this way it is easier to correct the errors of rotation, translation, expansion and magnification. Naturally the positioning marks must be situated in zones of the plate that can be read by the positioning equipment that will carry out the step of subsequent lithography.

The invention is not limited to the embodiments described in the foregoing, but extends to any embodiment in conformity with its spirit.

The invention claimed is:

1. A lithography method comprising:
   a preparation, during which a resist layer is deposited on a substrate;
   a preliminary lithography carried out to define at least one preliminary pattern in the resist layer, wherein the preliminary lithography comprises nanoimprinting, during which a mold provided with reliefs penetrates into the resist layer to generate in a single step the at least one preliminary pattern and at least one positioning mark forming a pattern in the resist layer, at least some of the patterns generated by the mold having different depths; and
   at least one subsequent lithography applied to the resist layer and including:
      a preliminary positioning including positioning a lithography apparatus as a function of the at least one positioning mark;
      at least one formation of additional patterns in the resist layer using the lithography apparatus positioned as a function of the at least one positioning mark, the formation of the additional patterns comprising exposure of at least part of a preliminary pattern,
      wherein the preliminary lithography defines first zones having a first thickness and second zones each having a thickness smaller than the first thickness, and wherein the at least one subsequent lithography is carried out to make the resist layer disappear at least partly at least some of the second zones.

2. A method according to claim 1, wherein the formation of additional patterns is carried out to superpose the preliminary pattern with an additional pattern to form in the resist layer at least one final hollow pattern having at least two levels of depth in the resist layer.

3. A method according to claim 1, wherein the formation of additional patterns is carried out to form in the resist layer at least one final projecting pattern having at least two levels of height.

4. A method according to claim 1, wherein the positioning comprises detection of the positioning marks by light diffraction.

5. A method according to claim 1, wherein at least one among the additional patterns is separated from the at least one preliminary pattern.

6. A method according to claim 1, further comprising, following the at least one subsequent lithography, a transfer including transferring the at least one preliminary pattern and the additional patterns from the resist layer into the substrate.

7. A method according to claim 1, wherein the at least one positioning mark is preserved at the end of the at least one subsequent lithography.

8. A method according to claim 7, wherein the at least one positioning mark is transferred from the resist layer into the substrate.

9. A method according to claim 6, wherein the at least one positioning mark is eliminated during the at least one subsequent lithography.

10. A method according to claim 6, wherein the transfer comprises etching the resist layer and the substrate, the etching having substantially identical selectivity for the resist layer and for the substrate.

11. A method according to claim 6, wherein the transfer is executed to transfer the at least one final pattern from the resist layer into the substrate to form in the substrate at least one final three-dimensional pattern having two levels of etching depth.

12. A method according to claim 11, further comprising supplying an electrically conductive material into the at least one final pattern.

13. A method according to claim 12, wherein, prior to the preparation, at least one layer of an integrated circuit is formed in the substrate, and wherein the transfer and the supplying are executed so that the electrically conductive material forms a line and a vertical interconnection connecting the line to the at least one layer of the integrated circuit.

14. A method according to claim 1, wherein the resist layer includes a photosensitive resist, wherein the formation of additional patterns in the resist layer comprises photolithography, and wherein the exposure comprises irradiation of one part at least of the at least one preliminary pattern.

15. A method according to claim 1, wherein the formation of additional patterns in the resist layer comprises electron-beam lithography or ion-beam lithography, and wherein the exposure comprises writing of one part at least of the at least one preliminary pattern.

16. A method according to claim 14, wherein the nanoimprinting is carried out so that a residue of resist is made to appear at a bottom of a hollow formed by the preliminary pattern, and wherein the formation of additional patterns is carried out to make the resist residues at the bottom of the hollow disappear or to create, in the resist residue, at least one opening extending from the hollow to the substrate.

17. A method according to claim 16, wherein the resist is a positive photosensitive resist, wherein the subsequent lithography comprises photolithography comprising irradiation carried out to irradiate the resist residue at least partly to make the resist residue at the bottom of the hollow disappear or to create at least one opening extending from the hollow to the substrate.

18. A method according to claim 1, comprising plural subsequent lithographies, each comprising formation of additional patterns, a first subsequent lithography comprising photolithography and a second subsequent lithography comprising one among: photolithography, electron-beam lithography, ion-beam lithography.

19. A method according to claim 1, wherein the preliminary patterns have a depth different from a depth of the positioning marks.

20. A method according to claim 1, wherein the preliminary patterns have a depth smaller than a depth of the positioning marks.

21. A method according to claim 1, wherein the depth of all the positioning marks is identical and a depth of all the preliminary patterns is identical.

22. A method according to claim 1, wherein the mold includes reliefs having plural heights for defining preliminary patterns of different depths.

23. A lithography method comprising:
   a preparation, during which a resist layer is deposited on a substrate;
   a preliminary lithography carried out to define at least one preliminary pattern in the resist layer, wherein the preliminary lithography comprises nanoimprinting, during which a mold provided with reliefs penetrates into the resist layer to generate in a single step the at least one preliminary pattern and at least one positioning mark forming a pattern in the resist layer, at least some of the patterns generated by the mold having different depths; and at least one subsequent lithography applied to the resist layer and including:
- a preliminary positioning including positioning a lithography apparatus as a function of the at least one positioning mark; and
- at least one formation of additional patterns in the resist layer using the lithography apparatus positioned as a function of the at least one positioning mark, the formation of the additional patterns comprising exposure of at least part of a preliminary pattern, wherein the resist layer includes a positive photosensitive resist, wherein the formation of additional patterns in the resist layer comprises photolithography, the exposure comprises irradiation of one part at least of the at least one preliminary pattern, the nanoimprinting is carried out so that a residue of resist is made to appear at a bottom of a hollow formed by the preliminary pattern, and the subsequent lithography comprises photolithography comprising irradiation carried out to irradiate the resist residue at least partly to make the resist residue at the bottom of the hollow disappear or to create at least one opening extending from the hollow to the substrate.

* * * * *